United States Patent
Wadhwa et al.

(10) Patent No.: US 12,294,359 B2
(45) Date of Patent: May 6, 2025

(54) SYSTEM FOR CONTROLLING LEAKAGE CURRENT IN INTEGRATED CIRCUITS

(71) Applicant: NXP B.V., Eindhoven (NL)

(72) Inventors: Sanjay Kumar Wadhwa, Noida (IN); Divya Tripathi, Noida (IN); Saurabh Goyal, Sonipat (IN); Alvin Leng Sun Loke, San Diego, CA (US); Manish Kumar Upadhyay, New Delhi (IN)

(73) Assignee: NXP B.V., Eindhoven (NL)

( * ) Notice: Subject to any disclaimer, the term of this patent is extended or adjusted under 35 U.S.C. 154(b) by 343 days.

(21) Appl. No.: 17/662,086

(22) Filed: May 5, 2022

(65) Prior Publication Data
US 2023/0361772 A1 Nov. 9, 2023

(51) Int. Cl.
*H03K 17/687* (2006.01)
(52) U.S. Cl.
CPC .................................. *H03K 17/6871* (2013.01)
(58) Field of Classification Search
CPC ...... H03K 17/6871; H01L 2027/11831; H01L 21/823481; H01L 27/088; H01L 27/0207
See application file for complete search history.

(56) References Cited

U.S. PATENT DOCUMENTS

| | | | |
|---|---|---|---|
| 5,410,161 A | 4/1995 | Narita | |
| 8,957,480 B2 | 2/2015 | Deguchi et al. | |
| 10,276,445 B2 | 4/2019 | Fan et al. | |
| 10,700,065 B2 | 6/2020 | Alptekin et al. | |
| 2013/0334609 A1* | 12/2013 | Deguchi | H01L 27/088 257/368 |

\* cited by examiner

*Primary Examiner* — Metasebia T Retebo

(57) ABSTRACT

An integrated circuit (IC) includes one or more active transistors and multiple series-coupled dummy transistors. The dummy transistors are coupled between two active transistors and/or at the ends of each active transistor. When the dummy transistors are coupled between two active transistors, apart from two conductive regions that are coupled to two active transistors, each remaining conductive region of the dummy transistors is maintained in a floating state to control a leakage current between the two active transistors. Similarly, when the dummy transistors are coupled at an end of one active transistor, apart from one conductive region that is coupled to the active transistor, each remaining conductive region of the dummy transistors is maintained in the floating state to control a leakage current between the active transistor and the dummy transistors.

20 Claims, 4 Drawing Sheets

SYSTEM FOR CONTROLLING LEAKAGE CURRENT IN INTEGRATED CIRCUITS

FIELD OF USE

The present disclosure relates generally to electronic circuits, and, more particularly, to a system for controlling a leakage current in integrated circuits.

BACKGROUND

In an integrated circuit (IC), dummy transistors are abutted to active transistors to maximize the mobility of the electrons in the active transistor. Additionally, the dummy transistors provide a significant improvement in transistor matching. The dummy transistors are electrically inactive with gate regions being at the same voltage level as source regions and/or drain regions. However, such a configuration of the dummy transistors creates a voltage difference between the active transistors and the dummy transistors, and in turn, results in a leakage current between the active transistors and the dummy transistors. The leakage current degrades the accuracy and the functionality of the IC.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
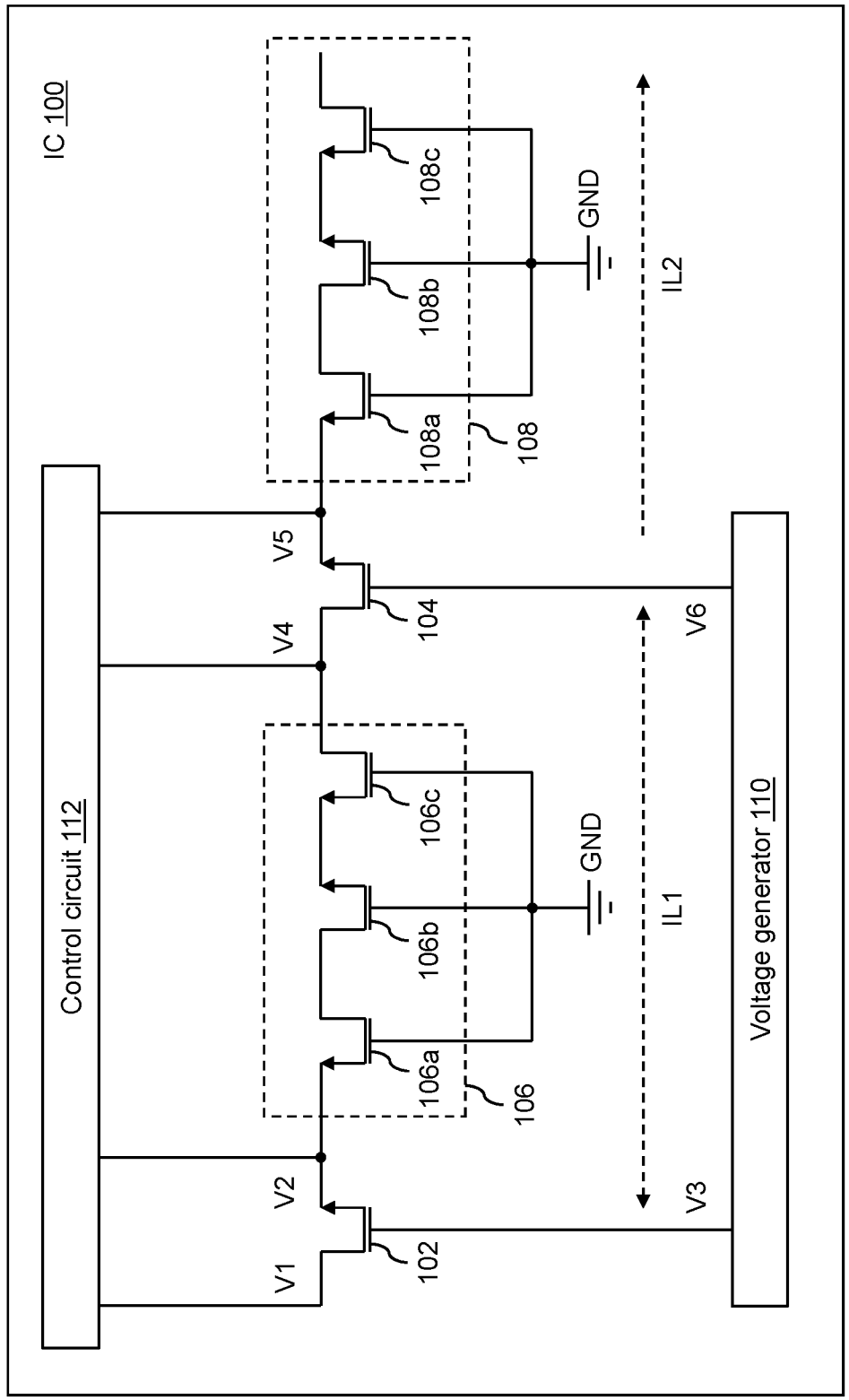
FIG. 1 illustrates a schematic circuit diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, an integrated circuit (IC) is disclosed. The IC may include an active transistor and a plurality of dummy transistors. The plurality of dummy transistors may be coupled in a series configuration. Each dummy transistor of the plurality of dummy transistors is electrically inactive. Further, a first dummy transistor of the plurality of dummy transistors may include first and second conductive regions. Similarly, each remaining dummy transistor of the plurality of dummy transistors may include first and second conductive regions. The first conductive region of the first dummy transistor may be coupled to the active transistor. Further, the second conductive region of the first dummy transistor and the first and second conductive regions of each remaining dummy transistor of the plurality of dummy transistors are maintained in a floating state to control a leakage current between the active transistor and the plurality of dummy transistors.

In some embodiments, the IC may further include an active diffusion area. The first and second conductive regions of the first dummy transistor and the first and second conductive regions of each remaining dummy transistor of the plurality of dummy transistors are formed on the active diffusion area. Further, the first conductive region of one remaining dummy transistor of the plurality of dummy transistors is formed at an end of the active diffusion area.

In some embodiments, the IC may further include a dielectric isolation region that may be formed around the active diffusion area to facilitate electrical isolation of the active diffusion area.

In some embodiments, the leakage current may be further controlled based on an effective channel length of the plurality of dummy transistors. The effective channel length may be determined based on a number of dummy transistors of the plurality of dummy transistors.

In some embodiments, each dummy transistor of the plurality of dummy transistors may further include a gate region. The gate region of each dummy transistor of the plurality of dummy transistors is at a first voltage level that renders each dummy transistor of the plurality of dummy transistors electrically inactive.

In some embodiments, the active transistor may include a first conductive region that is at a second voltage level. The first conductive region of the active transistor may be coupled to the first conductive region of the first dummy transistor. Further, the first conductive region of the active transistor may be electrically isolated from the second conductive region of the first dummy transistor and the first and second conductive regions of each remaining dummy transistor of the plurality of dummy transistors. The leakage current between the active transistor and the plurality of dummy transistors may be controlled based on the first conductive region of the active transistor being electrically isolated from the second conductive region of the first dummy transistor and the first and second conductive regions of each remaining dummy transistor of the plurality of dummy transistors.

In some embodiments, the active transistor may further include a gate region that is at a third voltage level and a second conductive region that is at a fourth voltage level. A difference between the third voltage level and one of a group consisting of the second and fourth voltage levels is greater than a threshold voltage of the active transistor, thereby rendering the active transistor electrically active.

In another embodiment of the present disclosure, an IC is disclosed. The IC may include first and second active transistors. The IC may further include a plurality of dummy transistors that may be coupled in a series configuration. Each dummy transistor of the plurality of dummy transistors is electrically inactive. First and second dummy transistors of the plurality of dummy transistors may each include first and second conductive regions. Further, each remaining dummy transistor of the plurality of dummy transistors may include first and second conductive regions. The first conductive region of the first dummy transistor may be coupled to the first active transistor, and the first conductive region of the second dummy transistor may be coupled to the second active transistor. Further, the second conductive region of the first dummy transistor, the second conductive region of the second dummy transistor, and the first and second conductive regions of each remaining dummy transistor of the plurality of dummy transistors are maintained in a floating state to control a leakage current between the first and second active transistors.

In some embodiments, the IC may further include an active diffusion area. The first and second conductive regions of the first dummy transistor, the first and second conductive regions of the second dummy transistor, and the first and second conductive regions of each remaining dummy transistor of the plurality of dummy transistors are formed on the active diffusion area.

In some embodiments, each dummy transistor of the plurality of dummy transistors may further include a gate region. The gate region of each dummy transistor of the plurality of dummy transistors is at a first voltage level that renders each dummy transistor of the plurality of dummy transistors electrically inactive.

In some embodiments, the first active transistor may include a first conductive region that is at a second voltage level and that is coupled to the first conductive region of the first dummy transistor. The second active transistor may include a first conductive region that is at a third voltage level and that is coupled to the first conductive region of the second dummy transistor. As the second conductive region of the first dummy transistor, the second conductive region of the second dummy transistor, and the first and second conductive regions of each remaining dummy transistor of the plurality of dummy transistors are maintained in the floating state, the first conductive region of the first active transistor is electrically isolated from the first conductive region of the second active transistor. The leakage current between the first and second active transistors may be controlled based on the electrical isolation between the first conductive region of the first active transistor and the first conductive region of the second active transistor.

In some embodiments, the first active transistor may further include a gate region that is at a fourth voltage level and a second conductive region that is at a fifth voltage level. A difference between the fourth voltage level and one of a group consisting of the second voltage level and the fifth voltage level is greater than a threshold voltage of the first active transistor, thereby rendering the first active transistor electrically active.

In some embodiments, the second active transistor may further include a gate region that is at a sixth voltage level and a second conductive region that is at a seventh voltage level. A difference between the sixth voltage level and one of a group consisting of the third voltage level and the seventh voltage level is greater than a threshold voltage of the second active transistor, thereby rendering the second active transistor electrically active.

In yet another embodiment of the present disclosure, an IC is disclosed. The IC may include a first active transistor and a second active transistor. The IC may further include a first plurality of dummy transistors that may be coupled in a series configuration. Similarly, the IC may include a second plurality of dummy transistors that may be coupled in the series configuration. First and second dummy transistors of the first plurality of dummy transistors may each include first and second conductive regions. Similarly, a third dummy transistor of the second plurality of dummy transistors may include first and second conductive regions. Further, each remaining dummy transistor of the first and second pluralities of dummy transistors may include first and second conductive regions. The first conductive region of the first dummy transistor may be coupled to the first active transistor and the first conductive region of the second dummy transistor may be coupled to the second active transistor. The second conductive region of the first dummy transistor, the second conductive region of the second dummy transistor, and the first and second conductive regions of each remaining dummy transistor of the first plurality of dummy transistors are maintained in a floating state to control a first leakage current between the first active transistor and the second active transistor. Further, the first conductive region of the third dummy transistor may be coupled to the second active transistor. The second conductive region of the third dummy transistor and the first and second conductive regions of each remaining dummy transistor of the second plurality of dummy transistors are maintained in the floating state to control a second leakage current between the second active transistor and the second plurality of dummy transistors.

Conventionally, to reduce a leakage current generated due to the dummy transistors in an integrated circuit (IC), source and drain regions of each dummy transistor are coupled to a conductive region (e.g., a source region or a drain region) of an associated active transistor. Such a configuration prevents the creation of a voltage difference between the active transistor and the dummy transistors, thereby reducing the leakage current therebetween. However, in such an IC, the coupling between the dummy transistors and the active transistor results in an increase in the capacitance at the active transistor, thereby degrading the operational speed of the active transistor.

Various embodiments of the present disclosure disclose an IC that may include one or more active transistors and multiple dummy transistors. The dummy transistors may be coupled to each other in a series configuration. Further, the dummy transistors may be coupled between two active transistors and/or at the ends of each active transistor. When the dummy transistors are coupled between two active transistors, a first conductive region of a first dummy transistor and a first conductive region of a second dummy transistor are coupled to the two active transistors, respectively. Further, a second conductive region of the first dummy transistor, a second conductive region of the second dummy transistor, and first and second conductive regions of each remaining dummy transistor are maintained in a floating state to control a leakage current between the two active transistors. Similarly, when the dummy transistors are coupled at an end of an active transistor, a first conductive region of a third dummy transistor is coupled to the active transistor. Further, a second conductive region of the third dummy transistor and first and second conductive regions of each remaining dummy transistor are maintained in the floating state to control a leakage current between the active transistor and the dummy transistors.

Thus, in the present disclosure, the leakage current is controlled based on the conductive regions of the dummy transistors being maintained in the floating state. As a result, the operational speed of the IC of the present disclosure is significantly greater than that of an IC where the conductive regions of the dummy transistors are coupled to the conductive region of an active transistor. Additionally, the leakage current in the IC of the present disclosure is significantly less than that in an IC where the conductive regions of the dummy transistors are at a ground voltage level or a supply voltage level. Thus, the IC of the present disclosure may be implemented in safety-critical applications (e.g., automotive applications).

FIG. 1 illustrates a schematic circuit diagram of an integrated circuit (IC) 100 in accordance with an embodiment of the present disclosure. The IC 100 may include a first active transistor 102, a second active transistor 104, a first plurality of dummy transistors 106, a second plurality of dummy transistors 108, a voltage generator 110, and a control circuit 112.

Each of the first and second active transistors 102 and 104 may include a first conductive region, a second conductive region, and a gate region. A conductive region of a transistor corresponds to a source region or a drain region. For the sake of ongoing discussion, it is assumed that the first and second conductive regions of each of the first and second active transistors 102 and 104 correspond to a drain region and a source region, respectively. The drain, source, and gate regions of the first active transistor 102 may be at first through third voltage levels V1-V3, respectively. Similarly, the drain, source, and gate regions of the second active transistor 104 may be at fourth through sixth voltage levels V4-V6, respectively. In an embodiment, each of the first and second active transistors 102 and 104 is an n-channel metal-oxide-semiconductor (NMOS) transistor. Thus, the first active transistor 102 is electrically active when a difference between the third and second voltage levels V3 and V2 is greater than a threshold voltage of the first active transistor 102. Similarly, the second active transistor 104 is electrically active when a difference between the sixth and fifth voltage levels V6 and V5 is greater than a threshold voltage of the second active transistor 104.

The first plurality of dummy transistors 106 may include a first dummy transistor 106a, a second dummy transistor 106b, and a third dummy transistor 106c. The first dummy transistor 106a may include a first conductive region, a second conductive region, and a gate region. Similarly, each of the second and third dummy transistors 106b and 106c may include a first conductive region, a second conductive region, and a gate region. For the sake of ongoing discussion, it is assumed that the first and second conductive regions of each of the first through third dummy transistors 106a-106c correspond to a drain region and a source region, respectively. In an embodiment, each of the first through third dummy transistors 106a-106c is an NMOS transistor.

Each dummy transistor of the first through third dummy transistors 106a-106c is electrically inactive. For example, the gate region of each of the first through third dummy transistors 106a-106c may be at a ground voltage level GND that renders the first through third dummy transistors 106a-106c electrically inactive.

The first through third dummy transistors 106a-106c may be coupled in a series configuration. Additionally, the first plurality of dummy transistors 106 is coupled between the first and second active transistors 102 and 104. Thus, the source region (e.g., the second conductive region) of the first dummy transistor 106a may be coupled to the source region (e.g., the second conductive region) of the first active transistor 102. Further, the drain region (e.g., the first conductive region) of the first dummy transistor 106a may be coupled to the drain region (e.g., the first conductive region) of the second dummy transistor 106b. Similarly, the source region (e.g., the second conductive region) of the second dummy transistor 106b may be coupled to the source region (e.g., the second conductive region) of the third dummy transistor 106c. Further, the drain region (e.g., the first conductive region) of the third dummy transistor 106c may be coupled to the drain region (e.g., the first conductive region) of the second active transistor 104.

The drain region of the first dummy transistor 106a, the drain and source regions of the second dummy transistor 106b, and the source region of the third dummy transistor 106c are maintained in a floating state. In such a scenario, the source region of the first active transistor 102 may be electrically isolated from the drain region of the first dummy transistor 106a and the drain and source regions of each remaining dummy transistor of the first plurality of dummy transistors 106. Consequently, the source region of the first active transistor 102 may be electrically isolated from the drain region of the second active transistor 104. In other words, the creation of a significant voltage difference between the source region of the first active transistor 102 and the drain region of the second active transistor 104 is prevented (e.g., a resistance of the first plurality of dummy transistors 106 is significant). The electrical isolation results in control (e.g., reduction or elimination) of a first leakage current IL1 between the first and second active transistors 102 and 104. The first leakage current IL1 may correspond to a sub-threshold current passing through the first plurality of dummy transistors 106 when the first plurality of dummy transistors 106 is electrically inactive. Thus, the drain region of the first dummy transistor 106a, the drain and source regions of the second dummy transistor 106b, and the source region of the third dummy transistor 106c are maintained in the floating state to control the first leakage current IL1 between the first and second active transistors 102 and 104.

The first leakage current IL1 may be additionally controlled based on an effective channel length of the first plurality of dummy transistors 106. The effective channel length is determined based on a number of dummy transistors of the first plurality of dummy transistors 106. For example, as the number of dummy transistors of the first plurality of dummy transistors 106 increases, the first leakage current IL1 decreases.

The second plurality of dummy transistors 108 may include a fourth dummy transistor 108a, a fifth dummy transistor 108b, and a sixth dummy transistor 108c. The fourth dummy transistor 108a may include a first conductive region, a second conductive region, and a gate region. Similarly, each of the fifth and sixth dummy transistors 108b and 108c may include a first conductive region, a second conductive region, and a gate region. For the sake of ongoing discussion, it is assumed that the first and second conductive regions of each of the fourth through sixth dummy transistors 108a-108c correspond to a drain region and a source region, respectively.

Each dummy transistor of the fourth through sixth dummy transistors 108a-108c is electrically inactive. In an embodiment, each of the fourth through sixth dummy transistors 108a-108c is an NMOS transistor. Thus, the gate region of each of the fourth through sixth dummy transistors 108a-108c may be at the ground voltage level GND that renders the fourth through sixth dummy transistors 108a-108c electrically inactive.

The fourth through sixth dummy transistors 108a-108c may be coupled in the series configuration. Additionally, the second plurality of dummy transistors 108 is coupled to the second active transistor 104 in series (e.g., coupled to one end of the second active transistor 104). Thus, the source region (e.g., the second conductive region) of the fourth dummy transistor 108a may be coupled to the source region (e.g., the second conductive region) of the second active transistor 104. Further, the drain region (e.g., the first conductive region) of the fourth dummy transistor 108a may be coupled to the drain region (e.g., the first conductive region) of the fifth dummy transistor 108b. Similarly, the source region (e.g., the second conductive region) of the fifth dummy transistor 108b may be coupled to the source region (e.g., the second conductive region) of the sixth dummy transistor 108c.

The drain region of the fourth dummy transistor 108a and the drain and source regions of each remaining dummy transistor of the second plurality of dummy transistors 108 are maintained in the floating state. In such a scenario, the source region of the second active transistor 104 is electrically isolated from the drain region of the fourth dummy transistor 108a and the drain and source regions of each remaining dummy transistor of the second plurality of dummy transistors 108. In other words, the creation of a significant voltage difference between the source region of the second active transistor 104 and the drain region of the sixth dummy transistor 108c is prevented (e.g., a resistance of the second plurality of dummy transistors 108 is significant). The electrical isolation results in the control of a second leakage current IL2 between the second active transistor 104 and the second plurality of dummy transistors 108. The second leakage current IL2 may correspond to a sub-threshold current passing through the second plurality of dummy transistors 108 when the second plurality of dummy transistors 108 is electrically inactive. Thus, the drain region of the fourth dummy transistor 108a, the drain and source regions of the fifth dummy transistor 108b, and the source and drain regions of the sixth dummy transistor 108c are maintained in the floating state to control the second leakage current IL2 between the second active transistor 104 and the second plurality of dummy transistors 108.

The second leakage current IL2 may be further controlled based on an effective channel length of the second plurality of dummy transistors 108. The effective channel length is determined based on a number of dummy transistors of the second plurality of dummy transistors 108. For example, as the number of dummy transistors of the second plurality of dummy transistors 108 increases, the second leakage current IL2 decreases.

Although not shown, another plurality of dummy transistors may be coupled to an end of the first active transistor 102 in a manner similar to the coupling of the second plurality of dummy transistors 108 to the second active transistor 104.

The voltage generator 110 may be coupled to the first and second active transistors 102 and 104. The voltage generator 110 may include suitable circuitry that may be configured to perform one or more operations. For example, the voltage generator 110 may be configured to generate a voltage equivalent to the third voltage level V3 and provide the generated voltage to the gate region of the first active transistor 102. Similarly, the voltage generator 110 may be further configured to generate a voltage equivalent to the sixth voltage level V6 and provide the generated voltage to the gate region of the second active transistor 104.

The control circuit 112 may be coupled to the first and second active transistors 102 and 104. The control circuit 112 may include suitable circuitry that may be configured to perform one or more operations. For example, the control circuit 112 may be configured to provide a voltage equivalent to the first voltage level V1 to the drain region of the first active transistor 102 and receive a voltage equivalent to the second voltage level V2 from the source region of the first active transistor 102. Similarly, the control circuit 112 may be configured to provide a voltage equivalent to the fourth voltage level V4 to the drain region of the second active transistor 104 and receive a voltage equivalent to the fifth voltage level V5 from the source region of the second active transistor 104. Thus, the control circuit 112 may correspond to any electronic circuit that operates in conjunction with a transistor (e.g., an active transistor).

Variations in the IC 100 of FIG. 1:

In a first variation, each of the first and second pluralities of dummy transistors 106 and 108 may include less than or more than three dummy transistors, without deviating from the scope of the present disclosure.

In a second variation, the first active transistor 102, the second active transistor 104, the first plurality of dummy transistors 106, and the second plurality of dummy transistors 108 may be p-channel metal-oxide-semiconductor (PMOS) transistors instead of NMOS transistors, without deviating from the scope of the present disclosure.

In a third variation, the first and second conductive regions may correspond to source and drain regions, respectively.

In a fourth variation, each of the first and second active transistors 102 and 104 and the first and second pluralities of dummy transistors 106 and 108 may be stacked transistors.

In a fifth variation, the first leakage current IL1 may be generated when the difference between the third and second voltage levels V3 and V2 is less than the threshold voltage of the first active transistor 102 and/or when the difference between the sixth and fifth voltage levels V6 and V5 is less than the threshold voltage of the second active transistor 104. Similarly, the second leakage current IL2 may be generated when the difference between the sixth and fifth voltage levels V6 and V5 is less than the threshold voltage of the second active transistor 104.

Figure 2:
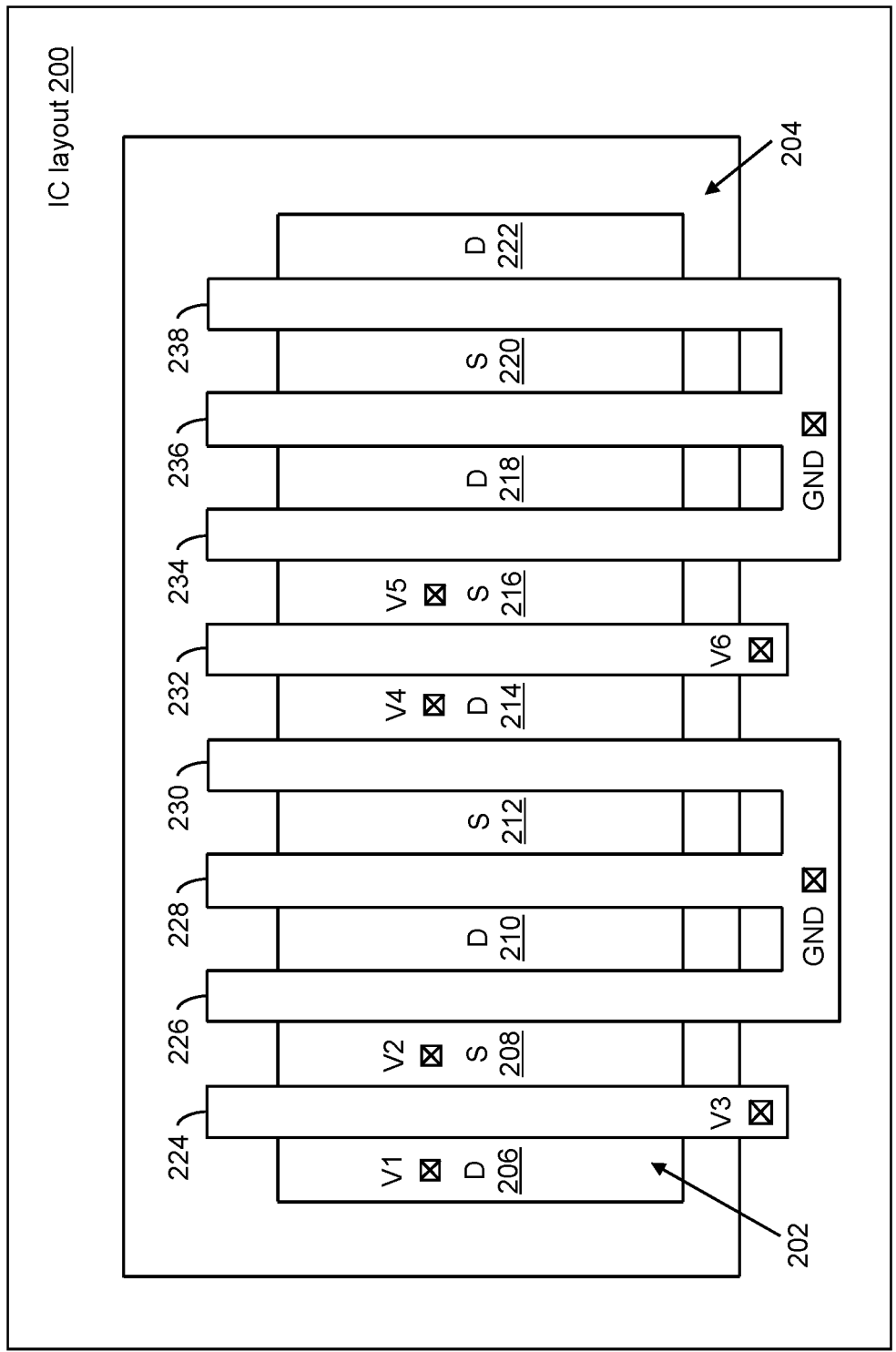
FIG. 2 illustrates a layout diagram of the IC of FIG. 1 in accordance with an embodiment of the present disclosure.

FIG. 2 illustrates a layout diagram 200 of the IC 100 in accordance with an embodiment of the present disclosure. The layout diagram of the IC 100 (hereinafter referred to as the "IC layout 200") may include an active diffusion area 202. The active diffusion area 202 may correspond to a p-type substrate or an n-type substrate. Further, the IC layout 200 may include a dielectric isolation region 204 that is formed around the active diffusion area 202 to facilitate electrical isolation of the active diffusion area 202.

The IC layout 200 may further include first through ninth impurity regions 206-222 and first through eighth gate electrodes 224-238. The first through ninth impurity regions 206-222 are formed on the active diffusion area 202 and each gate electrode is formed between two impurity regions. A gate electrode formed between two impurity regions results in the formation of a metal-oxide-semiconductor (MOS) transistor. Thus, the first through ninth impurity regions 206-222 and the first through eighth gate electrodes 224-238 result in the formation of eight MOS transistors on the active diffusion area 202.

The eight MOS transistors may sequentially correspond to the first active transistor 102, the first through third dummy transistors 106a-106c, the second active transistor 104, and the fourth through sixth dummy transistors 108a-108c. Thus, the first through eighth gate electrodes 224-238 correspond to the gate regions of the first active transistor 102, the first through third dummy transistors 106a-106c, the second active transistor 104, and the fourth through sixth dummy transistors 108a-108c, respectively. Further, one impurity region may be shared between two MOS transistors.

The first and second impurity regions 206 and 208 correspond to the drain and source regions of the first active transistor 102, respectively. Similarly, the second and third impurity regions 208 and 210 correspond to the source and drain regions of the first dummy transistor 106a, respectively, and the third and fourth impurity regions 210 and 212 correspond to the drain and source regions of the second dummy transistor 106b, respectively. Additionally, the fourth and fifth impurity regions 212 and 214 correspond to the source and drain regions of the third dummy transistor 106c, respectively. Thus, the second impurity region 208 corresponds to the source region that is shared between the first active transistor 102 and the first dummy transistor 106a. Further, the third impurity region 210 corresponds to the drain region that is shared between the first and second dummy transistors 106a and 106b, and the fourth impurity region 212 corresponds to the source region that is shared between the second and third dummy transistors 106b and 106c.

The fifth and sixth impurity regions 214 and 216 correspond to the drain and source regions of the second active transistor 104, respectively. Further, the sixth and seventh impurity regions 216 and 218 correspond to the source and drain regions of the fourth dummy transistor 108a, respectively, and the seventh and eighth impurity regions 218 and 220 correspond to the drain and source regions of the fifth dummy transistor 108b, respectively. Similarly, the eighth and ninth impurity regions 220 and 222 correspond to the source and drain regions of the sixth dummy transistor 108c, respectively. Thus, the fifth impurity region 214 corresponds to the drain region that is shared between the third dummy transistor 106c and the second active transistor 104, and the sixth impurity region 216 corresponds to the source region that is shared between the second active transistor 104 and the fourth dummy transistor 108a. Further, the seventh impurity region 218 corresponds to the drain region that is shared between the fourth and fifth dummy transistors 108a and 108b, and the eighth impurity region 220 corresponds to the source region that is shared between the fifth and sixth dummy transistors 108b and 108c. Further, the ninth impurity region 222 is formed at an end of the active diffusion area 202. In other words, the drain region of the sixth dummy transistor 108c is formed at an end of the active diffusion area 202.

Although not shown, the IC layout 200 may additionally include impurity regions and gate electrodes corresponding to another plurality of dummy transistors coupled to an end of the first active transistor 102.

The first and second impurity regions 206 and 208 may be at the first and second voltage levels V1 and V2 and the first gate electrode 224 may be at the third voltage level V3. Similarly, the fifth and sixth impurity regions 214 and 216 may be at the fourth and fifth voltage levels V4 and V5 and the fifth gate electrode 232 may be at the sixth voltage level V6. Further, the second, third, and fourth gate electrodes 226, 228, and 230 are at the ground voltage level GND, and the third and fourth impurity regions 210 and 212 are maintained in the floating state. As a result, the first leakage current IL1 between the first and second active transistors 102 and 104 is controlled. Similarly, the sixth, seventh, and eighth gate electrodes 234, 236, and 238 are at the ground voltage level GND, and the seventh through ninth impurity regions 218-222 are maintained in the floating state. As a result, the second leakage current IL2 between the second active transistor 104 and the second plurality of dummy transistors 108 is controlled.

Although not shown, the IC layout 200 may additionally include a layout of the voltage generator 110 and the control circuit 112.

Figure 3:
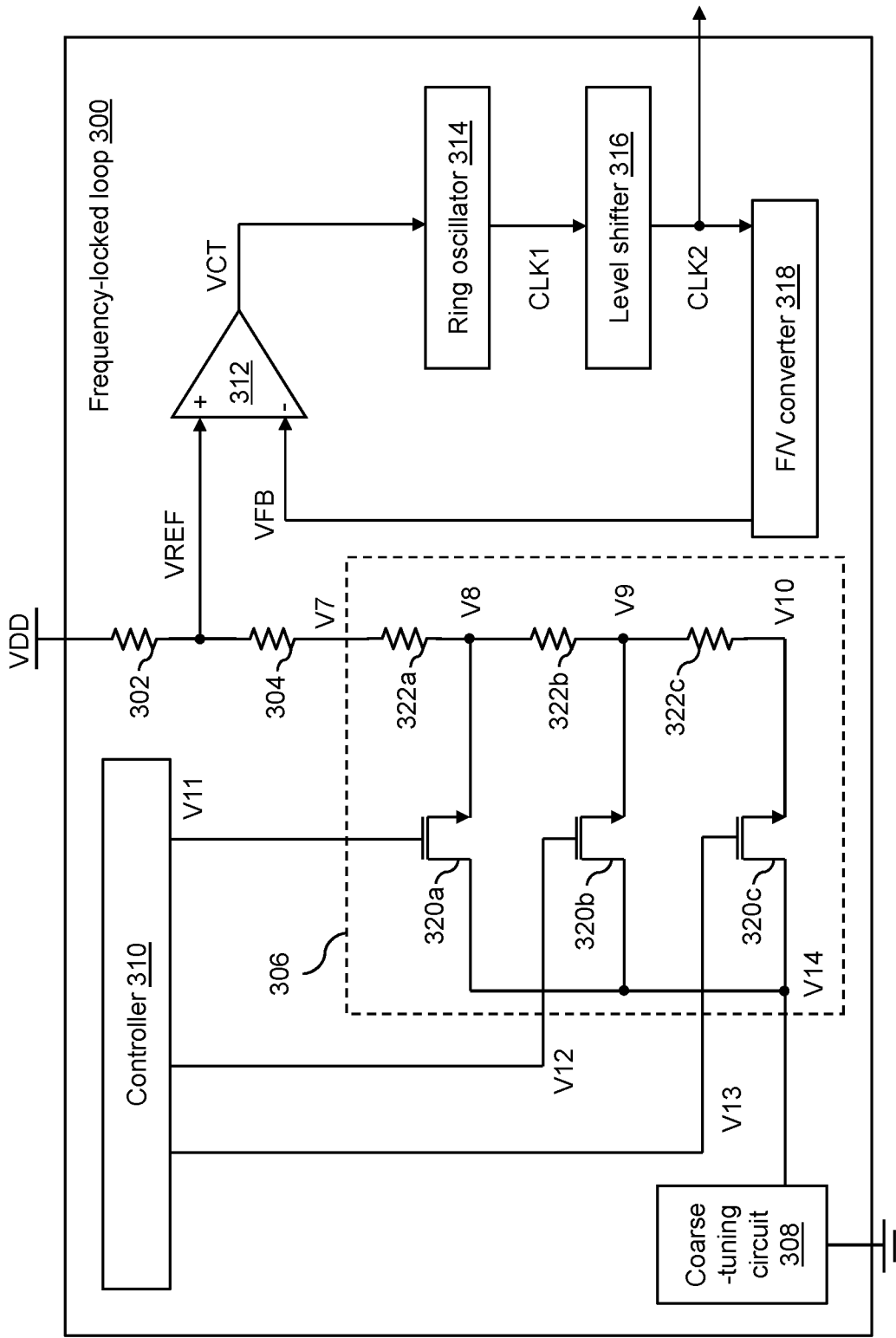
FIG. 3 illustrates a schematic circuit diagram of a frequency-locked loop in accordance with an embodiment of the present disclosure.

FIG. 3 illustrates a schematic circuit diagram of a frequency-locked loop 300 in accordance with an embodiment of the present disclosure. The frequency-locked loops (such as the frequency-locked loop 300) may be configured to generate clock signals having fixed frequencies, and hence, may be utilized in various electronic applications such as radio, telecommunication devices, computers, or the like.

The frequency-locked loop 300 corresponds to an exemplary circuit in which dummy transistors are abutted to active transistors in a manner similar to that described in FIG. 1 to control leakage currents therein. The manner in which dummy transistors are coupled to the active transistors may be utilized in various other circuits, without deviating from the scope of the present disclosure.

The frequency-locked loop 300 may include a first resistor 302 and a second resistor 304 coupled in series. For example, a first terminal of the first resistor 302 may be coupled to a first terminal of the second resistor 304. Further, a second terminal of the first resistor 302 may be coupled to a power supply (not shown), and may be configured to receive a supply voltage VDD. Additionally, a voltage equivalent to a seventh voltage level V7 may be generated at a second terminal of the second resistor 304 as a result of a voltage drop across the first and second resistors 302 and 304. In an example, resistances of the first and second resistors 302 and 304 are equal to 150 kilo-ohms (kΩ) and 75 kΩ, respectively. The frequency-locked loop 300 may further include a fine-tuning circuit 306, a coarse-tuning circuit 308, a controller 310, an amplifier 312, a ring oscillator 314, a level shifter 316, and a frequency-to-voltage converter (F/V converter) 318.

The fine-tuning circuit 306 may include a plurality of active transistors of which a third active transistor 320a, a fourth active transistor 320b, and a fifth active transistor 320c are shown. Additionally, the fine-tuning circuit 306 may include a plurality of resistors of which a third resistor 322a, a fourth resistor 322b, and a fifth resistor 322c are shown. Each of the third through fifth resistors 322a-322c may include a first terminal and a second terminal, and each of the third through fifth active transistors 320a-320c may include a first conductive region, a second conductive region, and a gate region. For the sake of ongoing discussion, it is assumed that the first and second conductive regions of each of the third through fifth active transistors 320a-320c correspond to drain and source regions, respectively.

The first terminal of the third resistor 322a may be coupled to the second terminal of the second resistor 304. In other words, the first terminal of the third resistor 322a may be at the seventh voltage level V7. Further, the plurality of resistors (e.g., the third through fifth resistors 322a-322c) may be coupled in the series configuration. In other words, the second terminal of the third resistor 322a may be coupled to the first terminal of the fourth resistor 322b, and the second terminal of the fourth resistor 322b may be coupled to the first terminal of the fifth resistor 322c. Further, the source regions of the third through fifth active transistors 320a-320c may be coupled to the second terminals of the third through fifth resistors 322a-322c, respectively. In such a scenario, voltages equivalent to eighth through tenth voltage levels V8-V10 may be generated at the source regions of the third through fifth active transistors 320a-320c as a result of the voltage drop across the third through fifth resistors 322a-322c, respectively.

The gate regions of the third through fifth active transistors 320a-320c may be at eleventh through thirteenth voltage levels V11-V13, respectively. Further, the drain regions of the third through fifth active transistors 320a-320c may be coupled to each other and may be at a fourteenth voltage level V14. In an embodiment, each of the third through fifth active transistors 320a-320c corresponds to an NMOS transistor. Thus, the third through fifth active transistors 320a-320c may be electrically active when the voltage differences between corresponding gate and source regions are greater than the associated threshold voltages. In an embodiment, at any instance, one of the third through fifth active transistors 320a-320c is activated.

The coarse-tuning circuit 308 may be coupled between the fine-tuning circuit 306 and a ground terminal. The coarse-tuning circuit 308 may be configured to receive a voltage equivalent to the fourteenth voltage level V14. The coarse-tuning circuit 308 may be structurally similar to the fine-tuning circuit 306 with the difference being in the resistance values of the associated resistors. For example, the resistance value of each of the third through fifth resistors 322a-322c is equal to 538 ohms (Ω), whereas the resistance value of each resistor of the coarse-tuning circuit 308 is equal to 10.7 kn.

The fine-tuning and coarse-tuning circuits 306 and 308 thus control the generation of a reference voltage VREF at the first terminals of the first and second resistors 302 and 304. In other words, the reference voltage VREF may be coarsely tuned by the coarse-tuning circuit 308, and the fine-tuning of the reference voltage VREF may be executed by the fine-tuning circuit 306. For example, when the third active transistor 320a and one of the active transistors of the coarse-tuning circuit 308 are activated, the first through third resistors 302, 304, and 322a and the resistors of the coarse-tuning circuit 308 form a voltage divider that results in the generation of the reference voltage VREF. The active transistors of the coarse-tuning circuit 308 may be activated in a manner similar to the activation of the active transistors of the fine-tuning circuit 306.

The controller 310 may be coupled to the fine-tuning circuit 306. The controller 310 may include suitable circuitry that may be configured to perform one or more operations. For example, the controller 310 may be configured to generate the voltages equivalent to the eleventh through thirteenth voltage levels V11-V13 and provide the generated voltages to the gate regions of the third through fifth active transistors 320a-320c, respectively.

The amplifier 312 may be coupled to the first terminal of the first resistor 302 and the F/V converter 318. The amplifier 312 may be configured to receive the reference voltage VREF from the first terminal of the first resistor 302. Further, the amplifier 312 may be configured to receive a feedback voltage VFB from the F/V converter 318. Based on the reference voltage VREF and the feedback voltage VFB, the amplifier 312 may be configured to generate a control voltage VCT. The control voltage VCT is an amplified version of a difference between the reference and feedback voltages VREF and VFB. The ring oscillator 314 may be coupled to the amplifier 312, and configured to receive the control voltage VCT from the amplifier 312 and generate a first clock signal CLK1 based on a voltage level of the control voltage VCT. The level shifter 316 may be coupled to the ring oscillator 314, and configured to receive the first clock signal CLK1 and execute a level-shifting operation on the first clock signal CLK1 to generate a second clock signal CLK2.

The F/V converter 318 may be coupled to the level shifter 316 and the amplifier 312. The F/V converter 318 may be configured to receive the second clock signal CLK2 and generate the feedback voltage VFB based on the frequency of the second clock signal CLK2. The reference voltage VREF and the feedback voltage VFB thus control the frequency of the second clock signal CLK2.

Although not shown, the frequency-locked loop 300 may include various other components (e.g., capacitors, bias circuits, or the like) that facilitate the generation of the second clock signal CLK2. Further, in the frequency-locked loop 300, the first and second resistors 302 and 304, the coarse-tuning circuit 308, the third through fifth resistors 322a-322c, the amplifier 312, the ring oscillator 314, the level shifter 316, and the F/V converter 318 may correspond to a control circuit (such as the control circuit 112) that operates in conjunction with the active transistors (e.g., the third through fifth active transistors 320a-320c).

The second clock signal CLK2 corresponds to an output of the frequency-locked loop 300. When the frequency-locked loop 300 is in a locked state, the frequency of the second clock signal CLK2 is inversely proportional to a product of resistance and capacitance values of a resistor-capacitor circuit (not shown) utilized in the F/V converter 318.

In a conventional frequency-locked loop, dummy transistors are coupled to the active transistors (e.g., the third through fifth active transistors 320a-320c) to maximize the mobility of the electrons in the active transistors. Typically, the dummy transistors are electrically inactive with gate regions being at the same voltage level as the source regions and/or drain regions. Such a configuration of the dummy transistors results in a leakage current between the active transistors and the dummy transistors. The leakage current offsets a reference voltage, especially across temperatures (e.g., as the temperature increases, the magnitude of the leakage current increases and the reference voltage is further offset). Such a reference voltage degrades the accuracy of the clock signal generated by the conventional frequency-locked loop. In other words, as a result of the leakage current, the frequency of the clock signal generated by the conventional frequency-locked loop may vary more than a tolerance limit of the conventional frequency-locked loop. Such variations in the clock signal degrade the functionality of the conventional frequency-locked loop.

In the present disclosure (e.g., as illustrated in FIG. 1), the dummy transistors that are abutted to the active transistors have floating state conductive regions that control a leakage current passing therethrough. As a result, the leakage current associated with the dummy transistors of the present disclosure is less than that in the conventional frequency-locked loop. Hence, the frequency variations of the second clock signal CLK2 are within a tolerance limit of the frequency-locked loop 300. The coupling of the dummy transistors to the third through fifth active transistors 320a-320c is illustrated in FIG. 4.

Figure 4:
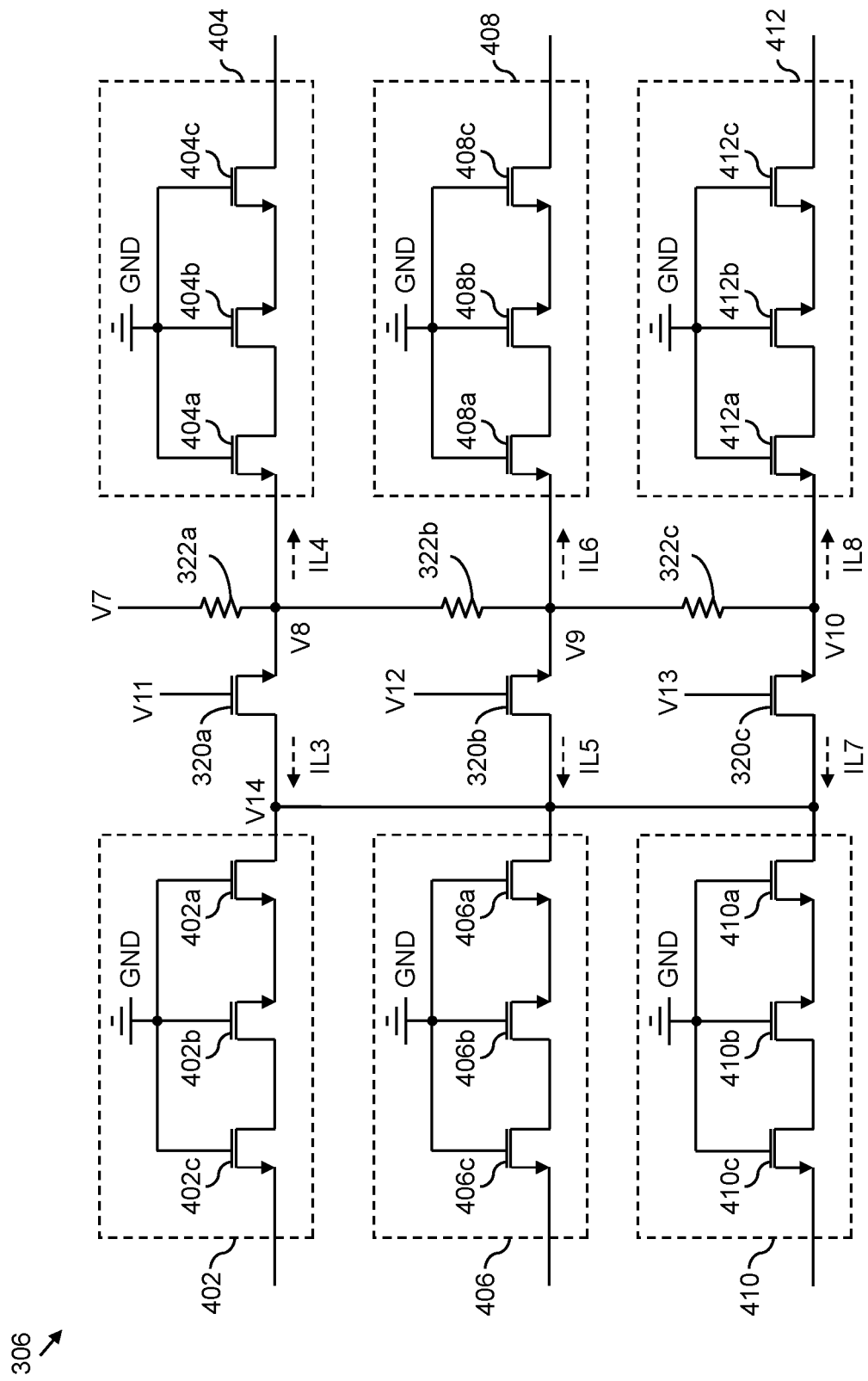
FIG. 4 illustrates a schematic circuit diagram of dummy transistors abutted to active transistors of a fine-tuning circuit of the frequency-locked loop of FIG. 3 in accordance with an embodiment of the present disclosure.

FIG. 4 illustrates a schematic circuit diagram of dummy transistors abutted to active transistors of the fine-tuning circuit 306 in accordance with an embodiment of the present disclosure. As described in FIG. 3, the fine-tuning circuit 306 may include the third through fifth active transistors 320a-320c and the third through fifth resistors 322a-322c. The fine-tuning circuit 306 may further include third and fourth pluralities of dummy transistors 402 and 404 that are coupled to two ends (e.g., conductive regions) of the third active transistor 320a, respectively. Similarly, the fine-tuning circuit 306 may further include fifth and sixth pluralities of dummy transistors 406 and 408 that are coupled to two ends (e.g., conductive regions) of the fourth active transistor 320b, respectively. Further, the fine-tuning circuit 306 may include seventh and eighth pluralities of dummy transistors 410 and 412 that are coupled to two ends (e.g., conductive regions) of the fifth active transistor 320c, respectively.

Each dummy transistor of the third through eighth pluralities of dummy transistors 402-412 may include a first conductive region, a second conductive region, and a gate region. For the sake of ongoing discussion, it is assumed that the first and second conductive regions of each dummy transistor of the third through eighth pluralities of dummy transistors 402-412 correspond to drain and source regions, respectively. Further, each dummy transistor of the third through eighth pluralities of dummy transistors 402-412 is electrically inactive. In an embodiment, each dummy transistor of the third through eighth pluralities of dummy transistors 402-412 is an NMOS transistor. Thus, the gate region of each dummy transistor of the third through eighth pluralities of dummy transistors 402-412 may be at the ground voltage level GND that renders the third through eighth pluralities of dummy transistors 402-412 electrically inactive.

The third plurality of dummy transistors 402 may include seventh through ninth dummy transistors 402a-402c that may be coupled in the series configuration. The drain region of the seventh dummy transistor 402a may be coupled to the drain region of the third active transistor 320a. Further, the source region of the seventh dummy transistor 402a and the source and drain regions of the eighth and ninth dummy transistors 402b and 402c are maintained in the floating state. As a result, the drain region of the third active transistor 320a is electrically isolated from the source region of the seventh dummy transistor 402a and the source and drain regions of the eighth and ninth dummy transistors 402b and 402c. Such electrical isolation controls a third leakage current IL3 between the third active transistor 320a and the third plurality of dummy transistors 402. The fourth plurality of dummy transistors 404 may include tenth through twelfth dummy transistors 404a-404c that may be coupled in the series configuration. The source region of the tenth dummy transistor 404a may be coupled to the source region of the third active transistor 320a. Further, the drain region of the tenth dummy transistor 404a and the source and drain regions of the eleventh and twelfth dummy transistors 404b and 404c are maintained in the floating state to control a fourth leakage current IL4 between the third active transistor 320a and the fourth plurality of dummy transistors 404. Further, the third plurality of dummy transistors 402, the third active transistor 320a, and the fourth plurality of dummy transistors 404 may be formed on a single active diffusion area (such as the active diffusion area 202).

The fifth plurality of dummy transistors 406 may include thirteenth, fourteenth, and fifteenth dummy transistors 406a, 406b, and 406c that may be coupled in the series configuration. Similarly, the sixth plurality of dummy transistors 408 may include sixteenth, seventeenth, and eighteenth dummy transistors 408a, 408b, and 408c that may be coupled in the series configuration. Further, the fifth and sixth pluralities of dummy transistors 406 and 408 may be coupled to the drain and source regions of the fourth active transistor 320b in a similar manner as the third and fourth pluralities of dummy transistors 402 and 404 are coupled to the third active transistor 320a, respectively. The fifth and sixth pluralities of dummy transistors 406 and 408 control fifth and sixth leakage currents IL5 and IL6 associated with the fourth active transistor 320b, respectively, in a similar manner as described above. Additionally, the fifth plurality of dummy transistors 406, the fourth active transistor 320b, and the sixth plurality of dummy transistors 408 may be formed on a single active diffusion area (such as the active diffusion area 202).

The seventh plurality of dummy transistors 410 may include nineteenth, twentieth, and twenty-first dummy transistors 410a, 410b, and 410c that may be coupled in the series configuration. Similarly, the eighth plurality of dummy transistors 412 may include twenty-second, twenty-third, and twenty-fourth dummy transistors 412a, 412b, and 412c that may be coupled in the series configuration. Further, the seventh and eighth pluralities of dummy transistors 410 and 412 may be coupled to the drain and source regions of the fifth active transistor 320c in a similar manner as the third and fourth pluralities of dummy transistors 402 and 404 are coupled to the third active transistor 320a, respectively. The seventh and eighth pluralities of dummy transistors 410 and 412 control seventh and eighth leakage currents IL7 and IL8 associated with the fifth active transistor 320c, respectively, in a similar manner as described above. Additionally, the seventh plurality of dummy transistors 410, the fifth active transistor 320c, and the eighth plurality of dummy transistors 412 may be formed on a single active diffusion area (such as the active diffusion area 202).

Although not shown, the layout diagram of the frequency-locked loop 300 may be similar to the IC layout 200 illustrated in FIG. 2.

The frequency-locked loop 300 illustrated in FIGS. 3 and 4 describe the abutment of the dummy transistors to the ends of one active transistor. However, in various other circuits, the dummy transistors may be coupled between two active transistors as described in FIG. 1, without deviating from the scope of the present disclosure.

Although it is described that dummy transistors are abutted to the active transistors of the fine-tuning circuit 306, the scope of the present disclosure is not limited to it. In various other embodiments, the dummy transistors may be abutted to the active transistors of the coarse-tuning circuit 308 in a similar manner, without deviating from the scope of the present disclosure.

Conventionally, to reduce a leakage current observed in the dummy transistors of an integrated circuit (IC), source and drain regions of each dummy transistor are coupled to a conductive region (e.g., a source region or a drain region) of an active transistor. Such a configuration prevents the creation of a voltage difference between the active transistor and the dummy transistors, thereby reducing the leakage current therebetween. However, in such an IC, the coupling between the dummy transistors and the active transistor results in an increase in the capacitance at the active transistor, thereby degrading the operational speed of the active transistor.

In the present disclosure, the dummy transistors having floating source and drain regions control the leakage current. As a result, the operational speed of the IC 100 is significantly greater than that of an IC where the source and drain regions of the dummy transistors are coupled to the source/drain region of an active transistor. Additionally, the leakage current in the IC 100 is significantly less than that in an IC where the source and drain regions of the dummy transistors are at a ground voltage level or a supply voltage level. The IC 100 may thus be implemented in safety-critical applications (e.g., automotive applications).

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit (IC), comprising:
an active transistor; and
a plurality of dummy transistors that is coupled in a series configuration,
wherein each dummy transistor of the plurality of dummy transistors is electrically inactive,
wherein a first dummy transistor of the plurality of dummy transistors comprises (i) a first conductive region that is coupled to the active transistor and (ii) a second conductive region,
wherein each remaining dummy transistor of the plurality of dummy transistors comprises a first conductive region and a second conductive region, and
wherein (i) the second conductive region of the first dummy transistor and (ii) the first conductive region and the second conductive region of each remaining dummy transistor of the plurality of dummy transistors are maintained in a floating state to control a leakage current between the active transistor and the plurality of dummy transistors.

2. The IC of claim 1, further comprising an active diffusion area, wherein the first conductive region and the second conductive region of the first dummy transistor and the first conductive region and the second conductive region of each remaining dummy transistor of the plurality of dummy transistors are formed on the active diffusion area, and wherein the first conductive region of one remaining dummy transistor of the plurality of dummy transistors is formed at an end of the active diffusion area and is maintained in the floating state.

3. The IC of claim 2, further comprising a dielectric isolation region that is formed around the active diffusion area to facilitate electrical isolation of the active diffusion area.

4. The IC of claim 1, wherein the leakage current is further controlled based on an effective channel length of the plurality of dummy transistors, and wherein the effective channel length is determined based on a number of dummy transistors of the plurality of dummy transistors.

5. The IC of claim 1, wherein each dummy transistor of the plurality of dummy transistors further comprises a gate region, and wherein the gate region of each dummy transistor of the plurality of dummy transistors is at a first voltage level that renders each dummy transistor of the plurality of dummy transistors electrically inactive.

6. The IC of claim 1, wherein the active transistor comprises a first conductive region that is at a second voltage level, wherein the first conductive region of the active transistor is coupled to the first conductive region of the first dummy transistor, and is electrically isolated from the second conductive region of the first dummy transistor and the first conductive region and the second conductive region of each remaining dummy transistor of the plurality of dummy transistors, and wherein the leakage current between the active transistor and the plurality of dummy transistors is controlled based on the electrical isolation between (i) the first conductive region of the active transistor and (ii) the second conductive region of the first dummy transistor and the first conductive region and the second conductive region of each remaining dummy transistor of the plurality of dummy transistors.

7. The IC of claim 6, wherein the active transistor further comprises (i) a gate region that is at a third voltage level and (ii) a second conductive region that is at a fourth voltage level, and wherein a difference between the third voltage level and one of a group consisting of the second voltage level and the fourth voltage level is greater than a threshold voltage of the active transistor, thereby rendering the active transistor electrically active.

8. An integrated circuit (IC), comprising:
a first active transistor and a second active transistor; and
a plurality of dummy transistors coupled in a series configuration,
wherein each dummy transistor of the plurality of dummy transistors is electrically inactive,
wherein a first dummy transistor of the plurality of dummy transistors comprises (i) a first conductive region that is coupled to the first active transistor and (ii) a second conductive region,
wherein a second dummy transistor of the plurality of dummy transistors comprises (i) a first conductive region that is coupled to the second active transistor and (ii) a second conductive region,
wherein each remaining dummy transistor of the plurality of dummy transistors comprises a first conductive region and a second conductive region, and
wherein (i) the second conductive region of the first dummy transistor, (ii) the second conductive region of the second dummy transistor, and (iii) the first conductive region and the second conductive region of each remaining dummy transistor of the plurality of dummy transistors are maintained in a floating state to control a leakage current between the first active transistor and the second active transistor.

9. The IC of claim 8, further comprising an active diffusion area, wherein the first conductive region and the second conductive region of the first dummy transistor, the first conductive region and the second conductive region of the second dummy transistor, and the first conductive region and the second conductive region of each remaining dummy transistor of the plurality of dummy transistors are formed on the active diffusion area and is maintained in the floating state.

10. The IC of claim 9, further comprising a dielectric isolation region that is formed around the active diffusion area to facilitate electrical isolation of the active diffusion area.

11. The IC of claim 8, wherein the leakage current is further controlled based on an effective channel length of the plurality of dummy transistors, and wherein the effective channel length is determined based on a number of dummy transistors of the plurality of dummy transistors.

12. The IC of claim 8, wherein each dummy transistor of the plurality of dummy transistors further comprises a gate region, and wherein the gate region of each dummy transistor of the plurality of dummy transistors is at a first voltage level that renders each dummy transistor of the plurality of dummy transistors electrically inactive.

13. The IC of claim 8, wherein the first active transistor comprises a first conductive region that is at a second voltage level and that is coupled to the first conductive region of the first dummy transistor, wherein the second active transistor comprises a first conductive region that is at a third voltage level and that is coupled to the first conductive region of the second dummy transistor, wherein as the second conductive region of the first dummy transistor, the second conductive region of the second dummy transistor, and the first conductive region and the second conductive region of each remaining dummy transistor of the plurality of dummy transistors are maintained in the floating state, the first conductive region of the first active transistor is electrically isolated from the first conductive region of the second active transistor, and wherein the leakage current between the first active transistor and the second active transistor is controlled based on the electrical isolation between the first conductive region of the first active transistor and the first conductive region of the second active transistor.

14. The IC of claim 13, wherein the first active transistor further comprises (i) a gate region that is at a fourth voltage level and (ii) a second conductive region that is at a fifth voltage level, and wherein a difference between the fourth voltage level and one of a group consisting of the second voltage level and the fifth voltage level is greater than a threshold voltage of the first active transistor, thereby rendering the first active transistor electrically active.

15. The IC of claim 13, wherein the second active transistor further comprises (i) a gate region that is at a sixth voltage level and (ii) a second conductive region that is at a seventh voltage level, and wherein a difference between the sixth voltage level and one of a group consisting of the third voltage level and the seventh voltage level is greater than a threshold voltage of the second active transistor, thereby rendering the second active transistor electrically active.

16. An integrated circuit (IC), comprising:
(i) a first active transistor, (ii) a second active transistor, (iii) a first plurality of dummy transistors that is coupled in a series configuration, and (iv) a second plurality of dummy transistors that is coupled in the series configuration,
wherein a first dummy transistor of the first plurality of dummy transistors comprises (i) a first conductive region coupled to the first active transistor and (ii) a second conductive region, and a second dummy transistor of the first plurality of dummy transistors comprises (i) a first conductive region that is coupled to the second active transistor and (ii) a second conductive region,
wherein a third dummy transistor of the second plurality of dummy transistors comprises (i) a first conductive region coupled to the second active transistor and (ii) a second conductive region,
wherein each remaining dummy transistor of the first plurality of dummy transistors and the second plurality of dummy transistors comprises a first conductive region and a second conductive region,
wherein (i) the second conductive region of the first dummy transistor, (ii) the second conductive region of the second dummy transistor, and (iii) the first conductive region and the second conductive region of each remaining dummy transistor of the first plurality of dummy transistors are maintained in a floating state to control a first leakage current between the first active transistor and the second active transistor, and
wherein (i) the second conductive region of the third dummy transistor and (ii) the first conductive region and the second conductive region of each remaining dummy transistor of the second plurality of dummy transistors are maintained in the floating state to control a second leakage current between the second active transistor and the second plurality of dummy transistors.

17. The IC of claim 16, further comprising an active diffusion area, wherein (i) the first conductive region and the second conductive region of the first dummy transistor, (ii) the first conductive region and the second conductive region of the second dummy transistor, (iii) the first conductive region and the second conductive region of the third dummy transistor, (iv) the first conductive region and the second conductive region of each remaining dummy transistor of the first plurality of dummy transistors, and (v) the first conductive region and the second conductive region of each remaining dummy transistor of the second plurality of dummy transistors are formed on the active diffusion area, and wherein the first conductive region of one remaining dummy transistor of the second plurality of dummy transistors is formed at an end of the active diffusion area and is maintained in the floating state.

18. The IC of claim 16, wherein each dummy transistor of the first plurality of dummy transistors and the second plurality of dummy transistors further comprises a gate region, and wherein the gate region of each dummy transistor of the first plurality of dummy transistors and the second plurality of dummy transistors is at a first voltage level that renders each dummy transistor of the first plurality of dummy transistors and the second plurality of dummy transistors electrically inactive.

19. The IC of claim 16, wherein the first active transistor comprises a first conductive region that is at a second voltage level and that is coupled to the first conductive region of the first dummy transistor, wherein the second active transistor comprises a first conductive region that is at a third voltage level and that is coupled to the first conductive region of the second dummy transistor, wherein as the second conductive region of the first dummy transistor, the second conductive region of the second dummy transistor, and the first conductive region and the second conductive region of each remaining dummy transistor of the first plurality of dummy transistors are maintained in the floating state, the first conductive region of the first active transistor is electrically isolated from the first conductive region of the second active transistor, and wherein the first leakage current between the first active transistor and the second active transistor is controlled based on the electrical isolation between the first conductive region of the first active transistor and the first conductive region of the second active transistor.

20. The IC of claim 19, wherein the second active transistor further comprises a second conductive region that is at a fourth voltage level, wherein the second conductive region of the second active transistor is coupled to the first conductive region of the third dummy transistor, and is electrically isolated from the second conductive region of the third dummy transistor and the first conductive region and the second conductive region of each remaining dummy transistor of the second plurality of dummy transistors, and wherein the second leakage current between the second active transistor and the second plurality of dummy transistors is controlled based on the electrical isolation between (i) the second conductive region of the second active transistor and (ii) the second conductive region of the third dummy transistor and the first conductive region and the second conductive region of each remaining dummy transistor of the second plurality of dummy transistors.

* * * * *